United States Patent [19]

Brubaker

[11] Patent Number: 4,897,657

[45] Date of Patent: Jan. 30, 1990

[54] ANALOG-TO-DIGITAL CONVERTER HAVING ERROR DETECTION AND CORRECTION

[75] Inventor: James L. Brubaker, Campbell, Calif.

[73] Assignee: Integrated Device Technology, Inc., Santa Clara, Calif.

[21] Appl. No.: 205,854

[22] Filed: Jun. 13, 1988

[51] Int. Cl.[4] .......................................... H03M 1/00
[52] U.S. Cl. ..................................... 341/159; 341/96
[58] Field of Search .................... 341/96, 97, 118, 158, 341/159

[56] References Cited

U.S. PATENT DOCUMENTS

| | | | |
|---|---|---|---|
| 4,386,339 | 5/1983 | Henry et al. | 341/159 |
| 4,571,574 | 2/1986 | Krynicki | 341/158 |
| 4,586,025 | 4/1986 | Knierim | 341/97 |
| 4,591,825 | 5/1986 | Bucklen | 341/159 |
| 4,644,322 | 2/1987 | Fujita | 341/159 |
| 4,712,087 | 12/1987 | Traa | 341/118 |
| 4,733,220 | 3/1988 | Knierim | 341/96 |
| 4,763,106 | 8/1988 | Gulczynski | 341/159 |
| 4,774,498 | 9/1988 | Traa | 341/159 |

OTHER PUBLICATIONS

Bucklen, "Monolithic Bipolar Circuits for Video Speed Data Conversion", TRW, LSI Products Div., TRW-LST Publication TP2-10/79.
Tsukada et al., "CMOS 8b 25 MHz Flash ADC", IEEE Digest International Solid-State Circuits Conference, 1985, pp. 34, 35.

Primary Examiner—William M. Shoop, Jr.
Assistant Examiner—Helen Kim
Attorney, Agent, or Firm—Thomas E. Schatzel

[57] ABSTRACT

Employed is a thermometer-code-to-one-of-n converter having a number of similar portions each of which includes gates each configured to detect a zero-zero-one pattern and to develop a one-of-n signal, gates each configured to detect a one-zero-zero pattern (an invalid pattern) and to develop an error signal, gates configured to combine the error signals, and gates configured to gate the error signals with the one-of-n pattern signals to block (inhibit) one-of-n signals.

11 Claims, 2 Drawing Sheets

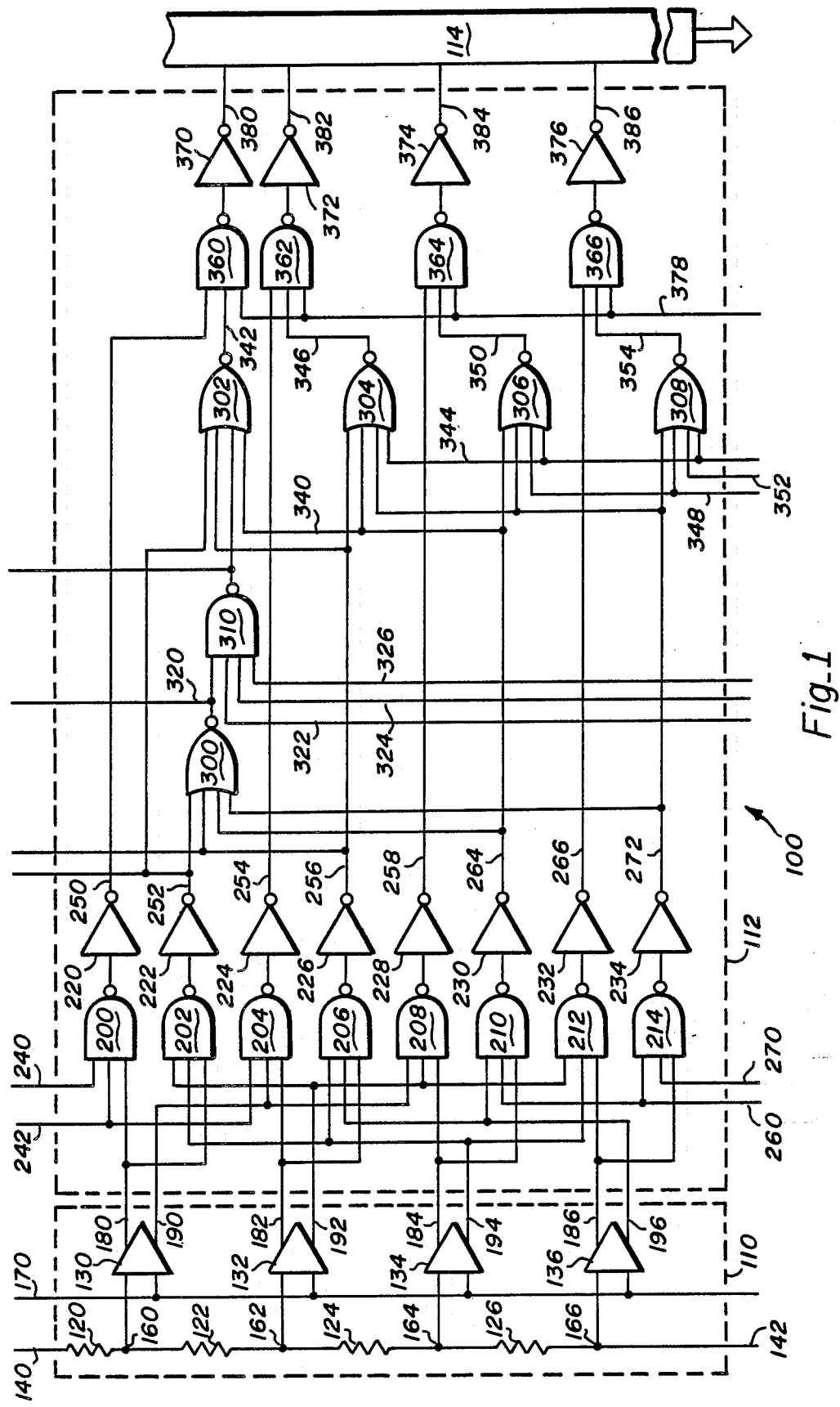
Fig_1

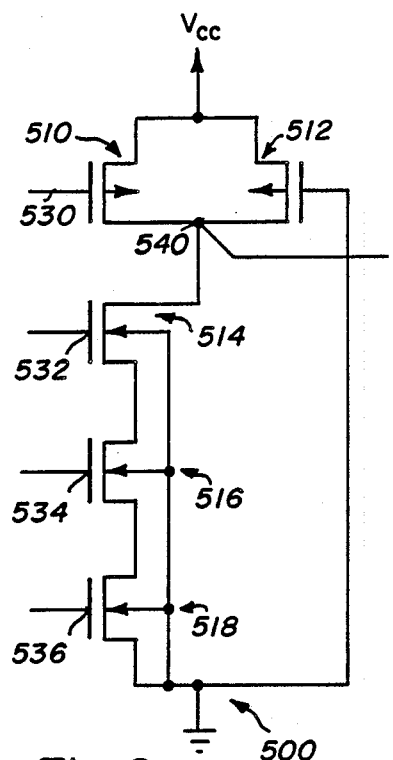
Fig_2
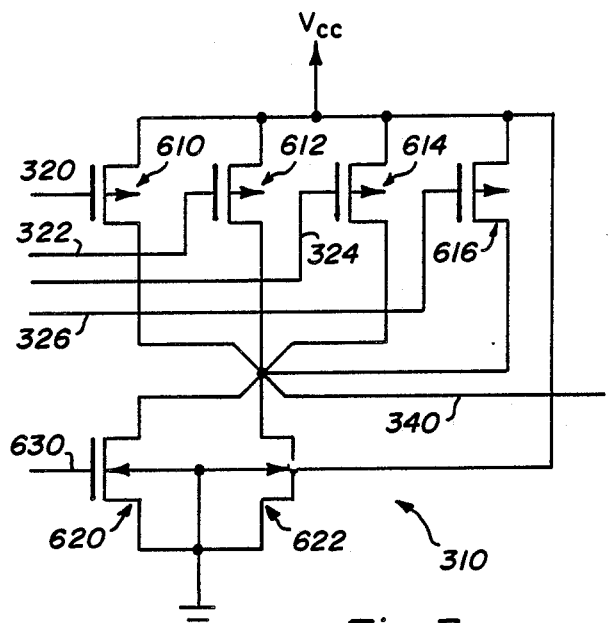
Fig_3
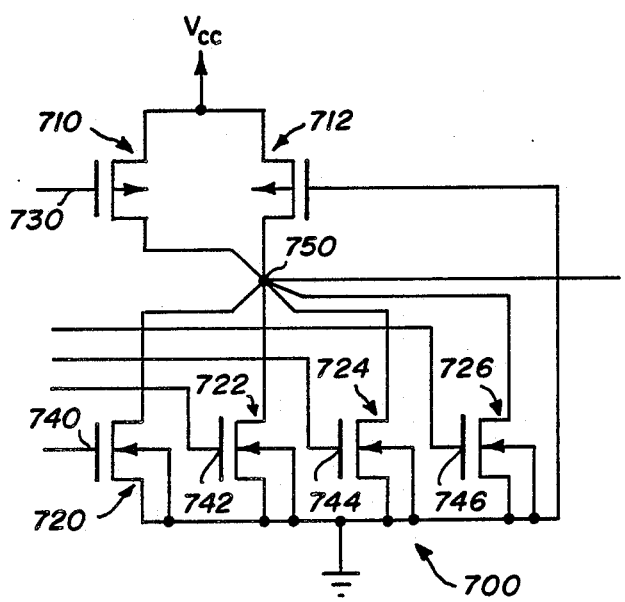
Fig_4

ANALOG-TO-DIGITAL CONVERTER HAVING ERROR DETECTION AND CORRECTION

TECHNICAL FIELD

The present invention relates to integrated circuits generally and more specifically to a thermometer-code-to-one-of-n converter for a flash-type analog-to-digital converter, the thermometer-code-to-one-of-n converter having error detection and correction.

BACKGROUND ART

Responsive to the instantaneous potential level of an analog signal, analog-to-digital (ADC) converters are operative to develop a number (i) of digital signals, the state of which represent, in binary notation, the instantaneous potential level of the analog signal. The more digital signals (binary bits) developed, the more accurate the representation.

The conversion process requires a period of time, which varies depending upon the conversion process employed. Where high conversion speed is required, analog-to-digital converters of the "flash-type" are used. Typically, flash-type analog-to-digital converters employ an analog-to-thermometer-code converter driving a thermometer-code-to-one-of-n converter (encoder) driving a one-of-n-to-binary-code (digital) converter (where n equals two to the ith power).

Typically, analog-to-thermometer-code converters include a number (two to the ith power) of resistors and a number (two to the ith power minus one) of comparators. The resistors, which are each of similar resistance, are connected in series (to form a resistor string) between a pair of reference potentials, to develop at the resistor-resistor junctions (nodes) a series (two to the ith power minus one) of reference potentials. Typically, the comparators are each configured, with the comparator inverting input connected to the corresponding one of the resistor-resistor junctions (nodes) to receive the corresponding one of the reference potentials; with the comparator non-inverting input connected to a line to receive the analog signal; and with the comparator output connected to form the corresponding one of the converter outputs.

When so configured, each of the comparators which is connected to a reference potential that is higher in potential level than the instantaneous potential level of the analog signal, develops, at the comparator output, a low logic level potential, which is, also, referred to herein as a logical "zero". Conversely, when so configured, each of the comparators which is connected to a reference potential that is lower in potential level than the instantaneous potential level of the analog signal, develops, at the comparator output, a high logic level potential, which is, also, referred to herein as a logical "one". Thus, the instantaneous potential level of the analog signal can be seen to lie between the lowest level reference potential which is connected to a comparator that is developing a low logic level potential (a zero) at it's output and the highest level reference potential which is connected to a comparator that is developing a high logic level potential (a one) at it's output. In other words, the instantaneous potential level of the analog signal is fixed by the zero-to-one transition of the comparator output signals.

Thermometer-code-to-one-of-n converters, typically, include a number (two to the ith power minus one) of AND (or NAND) gates (one for each comparator). Typically, each of the gates is of the two input type. One of the gates (which corresponds to the comparator which is connected to the highest level reference potential) has two true (non-negated) inputs. This gate is configured, with one of the gate inputs connected to the output of the highest level reference potential comparator; with the other gate input connected to the output of the comparator which is connected to the next highest level reference potential; and with the gate output connected to form a corresponding one of the converter outputs. The rest of the gates each have a negated (inverted) (complemented) input and a true (non-negated) input. These gates are each configured, (to detect a zero-one pattern) with the true (non-negated) input connected to the output of the corresponding one of the comparators (to detect the one); with the negated-input connected to the output of the comparator which is connected to the next highest level reference potential (to detect the zero); and with the gate output connected to form a corresponding one of the converter outputs. (Of course, an inverter driving a true (non-negated) gate input, functions as an negated input.)

When so configured, when no comparator errors (misfirings) occurs, each of the gates, but one, develops, at the gate output, a low logic level potential (a zero). The gate developing a high logic level potential (a one) corresponds to the comparator which is connected to the highest level reference potential that is lower in potential level than the instantaneous potential level of the analog signal (the zero-to-one transition point comparator). Unfortunately, when comparator errors (misfirings) do occurs, it is not uncommon for the associated one-of-n-to-binary-code (digital) converter to develop digital signals, the state of which represent a number that is substantially different than the instantaneous potential level of the analog signal.

Another thermometer-code-to-one-of-n converter is disclosed in the talk by Willard K. Bucklen, presented at MIDCON/79, and published in an Application Note entitled "Monolithic Bipolar Circuits For Video Speed Data Conversion", by TRW, LSI Products Division, TRW Electronic Components Group, P. O. Box 2472, La Jolla, CA 92038, dated Oct. 1979 (TRW-LSI Publication TP2-10/79). The Willard K. Bucklen converter includes AND gates, all but two of which have three inputs. One of the three-input AND gate inputs is of the negated (inverted) type; and, two of the AND gate inputs are of the true (non-negated) type. These gates are each configured to detect a zero-one-one pattern. More specifically, these gates are configured, with one of the true (non-negated) inputs connected to the output of the corresponding one of the comparators (to detect one of the ones); with the negated-input connected to the output of the comparator which is connected to the next highest level reference potential (to detect the zero); with the other one of the true (non-negated) inputs connected to the output of the comparator which is connected to the next lowest level reference potential (to detect the other one); and with the gate output connected to form a corresponding one of the converter outputs.

It is indicated in the Willard K. Bucklen article that the three-input AND gates, which detect a zero-one-one pattern, protect against "comparator misfirings within the range of zeros." Unfortunately, however, such protection is limited to but a single comparator misfiring within the zero range.

Another flash-type analog-to-digital converter is disclosed in the talk by Toshiro Tsukada, Yuuischi Nakatani, Eiki Imaizumi, Yoshitomi Toba, and Seiichi Ueda, entitled "Session II: Consumer ICs WAM 2.7: CMOS 8b 25 MHz Flash ADC", given at the 1985 IEEE International Solid-State Circuits Conference, and published in the "Digest Of Technical Papers, on pages 34 and 35 (0193-6530/85/0000-0034$01.00). The Toshiro Tsukada et al flash-type analog-to-digital converter employs an analog-to-thermometer-code converter driving a thermometer-code-to-gray-code converter driving a gray-code-to-binary-code (digital) converter.

Because of the nature of the gray code, when comparator errors (misfirings) occur, the number represented by the digital signals developed by the associated gray-code-to-binary-code (digital) converter is generally much closer in value to the instantaneous potential level of the analog signal. Unfortunately, the use of a thermometer-code-to-gray-code converter and a gray-code-to-binary-code (digital) converter result in relatively more complex analog-to-digital converter.

DISCLOSURE OF THE INVENTION

The primary object of the present invention is to provide a flash-type analog-to-digital converter which includes a thermometer-code-to-one-of-n converter (encoder) having error (comparator misfiring) detection and correction.

Another object of the present invention is to provide a flash-type analog-to-digital converter which is suitable for integration into a single device using CMOS technology.

Still another object of the present invention is to provide an integrated flash-type analog-to-digital converter which is relatively simple and inexpensive.

Briefly, the presently preferred embodiment of a thermometer-code-to-one-of-n converter having error detection and correction in accordance with the present invention has a number of similar portions each of which includes gates each configured to detect a zero-zero-one pattern and to develop a one-of-n signal, gates each configured to detect a one-zero-zero pattern (an invalid pattern) and to develop an error signal, gates configured to combine the error signals, and gates configured to gate the error signals with the one-of-n pattern signals to block (inhibit) invalid one-of-n signals.

These and other objects of the present invention will no doubt become apparent to those skilled in the art after having read the detailed description of the presently preferred embodiment of the present invention which is illustrated in the figures of the drawing.

BRIEF DESCRIPTION OF THE FIGURES IN THE DRAWING

FIG. 1 is a combined block and schematic diagram of a representative portion of a flash-type analog-to-digital converter having error detection and correction in accordance with the present invention.

FIG. 2 is a schematic diagram of a three-input NAND gate, which is typical of those shown in FIG. 1 of the drawing.

FIG. 3 is a schematic diagram of a four-input NAND gate, which is shown in FIG. 1 of the drawing.

FIG. 4 is a schematic diagram of a four-input NOR gate, which is typical of those shown in FIG. 1 of the drawing.

BEST MODE FOR CARRYING OUT THE INVENTION

The presently preferred embodiment of an eight-bit flash-type analog-to-digital converter having error detection and correction in accordance with the present invention has 64 similar portions, a typical one of which is illustrated in FIG. 1 of the drawing generally designated by the number 100. (Of course, alone, portion 100 functions as a two-bit analog-to-digital converter.) Portion 100 employs an analog-to-thermometer-code converter, which is designated 110, a thermometer-code-to-one-of-n (256) converter (encoder), which is designated 112, and a one-of-n-to-binary-code (digital) converter, which is designated 114.

Analog-to-thermometer-code converter 110 includes four resistors, respectively designated 120, 122, 124, and 126 and four comparators, respectively designated 130, 132, 134, and 136. The resistors (120, 122, 124, and 126), which are each of similar resistance, are connected in series between a pair of lines, respectively designated 140 and 142, each of which is connected to a respective reference potential. As a consequence, the resistors (120, 122, 124, and 126) develop at each of the resistor-resistor junctions (nodes), which are respectively designated 160, 162, 164, and 166, a respective reference potential.

The comparators (140, 142, 144, and 146) are each configured, with the comparator inverting input connected to the corresponding one of the resistor-resistor junctions (nodes) (160, 162, 164, and 166) to receive the corresponding one of the reference potentials and with the comparator non-inverting input connected to a line 170 to receive an analog signal. The true (non-inverting) (active high) output of each of the comparators is connected to a corresponding one of four lines, which are respectively designated 180, 182, 184, and 186; and, the complemented (inverting) (active low) output of each of the comparators is connected to a corresponding one of four lines, which are respectively designated 190, 192, 194, and 196. (The strobe (latch) input of each of the comparators (which, for clarity, is not shown) is connected to a line to receive a convert enabling signal.) (In the presently preferred embodiment, comparators are used which have differential-type circuitry that provides both a true and a complemented output. Of course, an inverter driven from the true output may be used to provide the complemented output.)

Operationally, normally, each of the comparators which is connected to a reference potential that is lower in potential level than the instantaneous potential level of the analog signal, develops on the line connected to the comparator true output a high logic level potential (a one) and develops on the line connected to the comparator complemented output a low logic level potential. Conversely, normally, each of the comparators which is connected to a reference potential that is higher in potential level than the instantaneous potential level of the analog signal, develops on the line connected to the comparator true output a low logic level potential (a zero) and develops on the line connected to the comparator complemented output a high logic level potential.

Thermometer-code-to-one-of-n converter 112 includes eight, three-input (true (non-negated) input) NAND gates, which are respectively designated 200, 202, 204, 206, 208, 210, 212, and 214, and eight, associated, inverters, which are respectively designated 220, 222, 224, 226, 228, 230, 232, and 234. (Each of the NAND gates in combination with a corresponding one of the inverters function as an AND gate.) To detect a zero-zero-one pattern and to develop a one-of-n signal, gate 200 is configured (with inverter 220, as a one-of-n detecting means), with one of the gate inputs coupled to the next higher (reference potential) portion by a line 240 (to detect one of the zeros); with another one of the gate inputs also coupled to the next higher portion, in this case, by a line 242 (to detect the other one of the zeros); with the other (remaining) gate input coupled to analog-to-thermometer-code converter 110 by line 180 (to detect the one); and with the gate output coupled by inverter 220 to a line 250.

To detect a one-zero-zero pattern (an invalid pattern) (an error condition, as will become apparent shortly) and to develop an error signal, gate 202 is configured (with inverter 222, as a error detecting means), with all of the gate inputs coupled to analog-to-thermometer-code converter 110, one of the gate inputs by line 192 (to detect one of the zeros), another one of the gate inputs by line 194 (to detect the other one of the zeros), and the other one of the gate inputs by line 180 (to detect the one). The output of gate 202 is coupled by inverter 222 to a line 252.

Like gate 200, to detect the zero-zero-one pattern and to develop a one-of-n signal, gate 204 is configured, with one of the gate inputs coupled to the next higher portion by line 242; with another one of the gate inputs coupled to analog-to-thermometer-code converter 110 by line 190; with the other one coupled to analog-to-thermometer-code converter 110 by line 182; and with the gate output coupled by inverter 224 to a line 254. And, like gate 202, to detect the one-zero-zero pattern and to develop an error signal, gate 206 is configured, with all of the gate inputs coupled to analog-to-thermometer-code converter 110, one by line 194, another one by line 196, and the other one by line 182. The output of gate 202 is coupled by inverter 226 to a line 256.

Continuing the pattern, gate 208 is configured, with the gate inputs connected, one to line 190, another one to line 192, and the other one to line 184. The output of gate 208 is coupled by inverter 228 to a line 258. Gate 210 is configured, with the gate inputs connected, one to line 196, another one to the next lower (reference potential) portion by a line 260; and the other one to line 184. Inverter 230 couples the output of gate 210 to a line 264. One input of gate 212 is connected to line 192; another input of the gate is connected to line 194; and, the other input of the gate is connected to line 186. The output of gate 212 is coupled by inverter 232 to a line 266. Gate 214 is configured, with the gate inputs connected, one to the next lower portion by line 260, another one to the next lower portion by a line 270; and the other one to line 186. Inverter 234 couples the output of gate 214 to a line 272.

To combine the error signals developed by gates 202, 206, 210, and 214, and similar gates in other portions, thermometer-code-to-one-of-n converter 112, additionally, includes five, four-input NOR gates, respectively designated 300, 302, 304, 306, and 308, and a four-input NAND gate 310 (configured as a signal combining means) NOR gate 300 is configured to "OR together" error condition signals developed by gates 202, 206, 210, and 214 (in conjunction with inverters 222, 226, 230, and 234). More specifically, gate 300 is configured, with the four gate inputs connected, one to line 252, another one to line 256, still another one to line 264, and the remaining one to line 272 and with the gate output connected to a line 320.

NAND gate 310 is configured to "OR together" (using negative logic to gate together active-low signals) error signals developed by gate 300 and gates similarly situated in the three lower portions. For this purpose, NAND gate 310 is configured with the four gate inputs connected, one to line 320 and the other three each to a different one of three lines, respectively designated 322, 324, and 326. Line 322 is connected to the line which corresponds to line 320 and which is in the next lower portion (once removed from portion 100). Line 324 is connected to the line that corresponds to line 320 and that is in the portion twice removed from portion 100; and, line 322 is connected to the line which corresponds to line 320 and which is in the portion three times removed from portion 100. The output of NAND gate 310 is connected to a line 340.

NOR gate 302 is configured to "OR together" error signals developed by gate 310 and gates 206, 210, and 214 (in conjunction with inverters 226, 230, and 234). More specifically, gate 302 is configured with the four gate inputs connected, one to line 340, another one to line 252, still another one to line 256, and the remaining one to line 264. The output of NOR gate 302 is connected to a line 342. To "OR together" error condition signals developed by gates 206, 210, and 214 (in conjunction with inverters 226, 230, and 234) and a gate situated in the next lower portion, NOR gate 304 is configured, with the gate inputs connect one to line 256, another one to line 264, still another one connected to line 272, and the remaining one to a line 344, and with the gate output connected to a line 346. Similarly, gate 306 is configured, with the gate inputs connect, one to line 264, another one to line 272, still another one to a line 348, and the remaining one to line 344, and with the gate output connected to a line 350. Finally, gate 308 is configured, with the gate inputs connect one to line 272, another one to line 348, still another one connected to a line 352, and the remaining one to line 344, and with the gate output connected to a line 354.

To gate the error signals with the one-of-n pattern signals (to block or inhibit invalid one-of-n signals), thermometer-code-to-one-of-n converter 112, additionally, includes four, three-input NAND gates, which are respectively designated 360, 362, 364, and 366 and four, associated, inverters, which are respectively designated 370, 372, 374, and 376. (Each of the NAND gates in combination with a corresponding one of the inverters function as an AND gate.) NAND gate 360 is configured to "AND together" one of the one-of-n pattern signals with one of the error signals and with an enabling signal. (The enabling signal provides a delay to allow time for the error signals to ripple up and propagate across.) For this purpose, gate 360 is configured (with inverter 370, as a blocking means), with the gate inputs connected, one to line 250 (to receive the one-of-m pattern signals), another one to line 342 (to receive the error signal), and the other one to a line 378 (to receive the enabling signal), and with the gate output coupled by inverter 370 to a line 380. Similarly, one input of gate 362 is connected to line 254; another input of the gate is connected to line 346; the other input of the gate is connected to line 376; and the output of the gate is coupled by inverter 372 to a line 382. Lines 258, 350, and 378 are each connected to a respective one of the three inputs of gate 364, the output of which is coupled by inverter 374 to line 384. Finally, Gate 366 is configured, with the gate inputs connected, one to line 266, another one to line 354, and the other one to line 378 and with the gate output coupled by inverter 376 to a line 386.

Operationally, gates 200, 204, 208, and 212 (in conjunction with inverters 220 224, 228, and 232) of portion 100 each detect a zero-zero-one pattern and develop a one-of-n signal. Gates 360, 362, 364, and 366 (in conjunction with inverters 370, 372, 374, and 376) each, selectively, couple a corresponding one of the (valid) one-of-n signals to one-of-n-to-binary-code converter 114. Gates 202, 206, 210, and 214 (in conjunction with inverters 222, 226, 230, and 234) each detect a one-zero-zero pattern (an invalid pattern) and develop an error signal. Gates 300, 310, 302, 304, 306, and 308 combine the error signals developed by gates 202, 206, 210, and 214 (and inverters 222, 226, 230, and 234) and develop signals for driving gates 360, 362, 364, and 366 to block (inhibit) invalid one-of-n signals. The error signals are combined to block corresponding one-of-n signals. In other words, the error signal developed by gate 202 (and inverter 222) blocks the (invalid) one-of-n signal developed by gate 200 (and inverter 220); the gate 206 signal blocks the gate 204 signal; the gate 210 signal blocks the gate 208 signal; and, the gate 214 signal blocks the gate 212 signal. In addition, the error signals are combined to block "higher level" one-of-n signals. In other words, the error signal developed by gate 214 (and inverter 234), also, blocks the (invalid) one-of-n signals developed by gate 208 (and inverter 228), gate 204 (and inverter 224), and gate 200 (and inverter 220). Similarly, the gate 210 signal, also, blocks the gate 204 signal and the gate 200 signal; and, the gate 206 signal, also, blocks the gate 200 signal. Further, the error signals are combined to block one-of-n signals developed in higher level portions. However, because of signal strength and propagation delay considerations, the signals are only used to block up to 16 higher level (invalid) one-of-n signals.

The highest level portion differs from portion 100 in that the lines which correspond to lines 240 and 242 are connected to a high logic level potential. The lowest level portion differs from portion 100 in that the lines which correspond to lines 260, 270, 322, 324, and 326 are connected to a high logic level potential and the lines which correspond to lines 348, 352, and 344 are connected to a low logic level potential. Further, the lowest level portion includes an additional resistor connected between the node that corresponds to node 166 and the reference potential to which the line that corresponds to line 142 is connected. The various portions are arranged as four columns of 64 portions. Because of signal strength and propagation delay considerations, not all signals are carried between columns.

In another embodiment, (in place of gates 202, 206, 210, and 214) two-input NAND gates are included each configured to detect a zero-zero "error" pattern and develop an "error" signal. It is important to note that the one-zero-zero pattern is an invalid pattern which only occurs when comparator errors (misfirings) occurs. As a consequence, when the one-zero-zero error pattern is used, the state of the signals developed by gates 202, 206, 210, 214, 300, 310, 302, 304, 306, and 308 and inverters 222, 226, 230, and 234 do not change state unless a comparator error (misfiring) occurs. On the other hand, the zero-zero "error" pattern can be either a valid pattern or an invalid (error) pattern. As a consequence, when the zero-zero "error" pattern is used, the state of the signals developed by gates 202, 206, 210, 214, 300, 310, 302, 304, 306, and 308 and inverters 222, 226, 230, and 234 change state on a regular basis even when no comparator errors (misfirings) occurs, causing the thermometer-code-to-one-of-n converter to consume additional power.

In one embodiment, one-of-n-to-binary-code (digital) converter 114 includes 255 "address" lines, each of which is connected to receive a corresponding one of the one-of-n signals. (Four of the "address" lines are connected, each to a respective one of lines 380, 382, 384, and 386.) In addition, eight "bit" lines are included each of which is located to cross each of the "address" lines. Also, included is circuitry for pre-charging each of the "bit" lines to a high-logic-level potential (a one). Further, a number of pull-down transistors are included each located at a respective one of selected "address"-line-"bit"-line crossings. The pull-down transistors are each configured to be responsive to a high-logic-level potential (a one) developed on the respective "address" line and to be operative to "pull-down" to a low-logic-level potential (a zero) the potential developed on the respective "bit" line. The pull-down transistor locations are selected such that for each of the one-of-n signals, signals are developed on each of the eight "bit" lines which are appropriate (in state) to represent, in binary (digital) notation, the number represented by the one-of-n signal. Finally, drivers (buffers) are included to develop from the "bit" line signals, signals suitable for driving an eight line output bus, represented by a bus 400. (In the presently preferred embodiment of one-of-n-to-binary-code (digital) converter 114, the two most significant bits are decoded only at the end of each of the four columns.)

Illustrated in FIG. 2 of the drawing is a three-input NAND gate, typical of those included in the analog-to-digital converter. The NAND gate, which is designated 500, has two P-channel field effect transistors (FETs), which are respectively designated 510 and 512, and three N-channel field effect transistors, which are respectively designated 514, 516, and 518. The transistors are configured, with the channels of transistors 510, 514, 516, and 518 connected in series between a power-supply potential (Vcc) and circuit ground. The gate of transistor 510 is connected to a line 530 to receive an active-low pre-charge controlling signal. The gates of transistors 512, 514, and 516, which are respectively designated 532, 534, and 536, each serve as a respective one of the three NAND gate inputs. Transistor 518 is configured, with the transistor channel connected in parallel with the channel of transistor 510 and with the transistor gate connected to circuit ground. The node at the juncture of transistors 510, 512, and 514, which is designated 540, serves as the NAND gate output. In the presently preferred embodiment, the following transistor channel width/length ratios are used.

|  | Gates 200–214 Channel W/L in Microns | Gates 360–366 Channel W/L in Microns |
| --- | --- | --- |
| Transistor 510 | 3/1.5 | 4/1.5 |
| Transistor 512 | 3/2.5 | 3/2.5 |
| Transistor 514 | 4/1 | 12/1 |
| Transistor 516 | 4/1 | 12/1 |
| Transistor 518 | 4/1 | 12/1 |

Turning now to FIG. 3 of the drawing, four-input NAND gate 310 is shown to have four P-channel field effect transistors, which are respectively designated 610, 612, 614, and 616, and two N-channel field effect transistors, which are respectively designated 620 and 622. The transistors are configured, with the channels of transistors 610 and 620 connected in series between a power-supply potential (Vcc) and circuit ground. The channels of transistors 612, 614, and 616 are each connected in parallel with the channel of transistor 610; and; the channel of transistor 622 is connected in parallel with the channel of transistor 620. The gates of transistors 610, 612, 614, and 616, which are shown connected to a respective one of lines 320, 322, 324, and 326, each serve as a respective one of the four NAND gate inputs. The gate of transistor 620 is connected to a line 630 to receive an (active-high) pre-charge controlling signal; and, the gate of transistor 622 is connected to a power-supply potential (Vcc). The node at the juncture of the transistors, which is shown connected to line 340, serves as the NAND gate output. In the presently preferred embodiment, the following transistor channel width/length ratios are used.

|  | Gate 310<br>Channel W/L in Microns |
| --- | --- |
| Transistor 610 | 16/1.5 |
| Transistor 612 | 16/1.5 |
| Transistor 614 | 16/1.5 |
| Transistor 616 | 16/1.5 |
| Transistor 620 | 6/1 |
| Transistor 622 | 3/6 |

In FIG. 4 of the drawing is illustrated a four-input NOR gate, typical of those included in the analog-to-digital converter. The NOR gate, which is designated 700 has two P-channel field effect transistors, which are respectively designated 710 and 712, and four N-channel field effect transistors, which are respectively designated 720, 722, 724, and 726. The transistors are configured, with the channels of transistors 710 and 720 connected in series between a power-supply potential (Vcc) and circuit ground. The channel of transistor 712 is connected in parallel with the channel of transistor 710; and, the channels of transistors 722, 724, and 726 are each connected in parallel with the channel of transistor 720. The gate of transistor 710 is connected to a line 730 to receive an active-low pre-charge controlling signal; the gate of transistor 712 is connected to circuit ground. The gates of transistors 720, 722, 724, and 726, which are respectively designated 740, 742, 744, and 746, each serve as a respective one of the four NOR gate inputs; and, the node at the juncture of transistors, which is designated 750, serves as the NOR gate output. In the presently preferred embodiment, the following transistor channel width/length ratios are used.

|  | Gates 302-308<br>Channel W/L in Microns |
| --- | --- |
| Transistor 710 | 16/1.5 |
| Transistor 712 | 3/2.5 |
| Transistor 720 | 24/1 |
| Transistor 722 | 24/1 |
| Transistor 724 | 24/1 |
| Transistor 726 | 24/1 |

In the presently preferred embodiment, all of the components of the above-described eight-bit flash-type analog-to-digital converter having error detection and correction are integrated into a single device using CMOS technology.

It is contemplated that after having read the preceding disclosure, certain alterations and modifications of the present invention will no doubt become apparent to those skilled in the art. It is therefore intended that the following claims be interpreted to cover all such alterations and modifications as fall within the true spirit and scope of the invention.

What is claimed is:

1. A thermometer-code-to-one-of-n converter for receiving a plurality of signals representing a number in thermometer code and for developing a plurality of signals representing the number in one-of-n code, the thermometer-code-to-one-of-n converter comprising in combination:

first error detecting means (206 and 226) connected to receive a first predetermined combination of at least two of the thermometer code signals, said first error detecting means for gating together said first combination of thermometer code signals and for developing a first error signal (256) the state of which indicates when said first combination of thermometer code signals has a first predetermined pattern of signal states;

first one-of-n detecting means (204 and 224) connected to receive a second predetermined combination of at least two of said thermometer code signals, said first one-of-n detecting means for gating together said second combination of thermometer code signals and for developing a first one-of-n signal (254) the state of which indicates when said second combination of thermometer code signals has a second predetermined pattern of signal states;

second error detecting means (202 and 222) connected to receive a third predetermined combination of at least two of said thermometer code signals, said second error detecting means for gating together said third combination of thermometer code signals and for developing a second error signal (252) the state of which indicates when said third combination of thermometer code signals has said first predetermined signal state pattern;

second one-of-n detecting means (200 and 220) connected to receive a fourth predetermined combination of at least two of said thermometer code signals, said second one-of-n detecting means for gating together said fourth combination of thermometer code signals and for developing a second one-of-n signal (250) the state of which indicates when said fourth combination of thermometer code signals has said second predetermined signal state pattern;

signal combining means (302 and 304) connected to said first and said second error detecting means, said signal combining means for gating together said first and said second error signals and for developing a first blocking signal (342) the state of which indicates when at least one of said first and said third combinations of thermometer code signals has said first predetermined signal state pattern;

first blocking means (362 and 372) connected to said first one-of-n detecting means and to said signal combining means, said first blocking means for gating together said first one-of-n signal and a signal derived from said first error signal and for developing a third one-of-n signal (382) having a predetermined state when said first combination of thermometer code signals has said first predetermined signal state pattern and having a state which indicates when said second combination of thermometer code signals has said second predetermined signal state pattern otherwise; and second blocking means (360 and 370) connected to said second one-of-n detecting means and to said signal combining means, said second blocking means for gating together said second one-of-n signal and said first blocking signal and for developing a fourth one-of-n signal (380) having a predetermined state when at least one of said first and said third combinations of thermometer code signals has said first predetermined signal state pattern and having a state which indicates when said fourth combination of thermometer code signals has said second predetermined signal state pattern otherwise.

2. A thermometer-code-to-one-of-n converter as recited in claim 1 further comprising, third error detecting means (210 and 230) connected to receive a fifth predetermined combination of at least two of said thermometer code signals, said third error detecting means for gating together said fifth combination of thermometer code signals and for developing a third error signal (264) the state of which indicates when said fifth combination of thermometer code signals has said first predetermined signal state pattern;

third one-of-n detecting means (208 and 228) connected to receive a sixth predetermined combination of at least two of said thermometer code signals, said third one-of-n detecting means for gating together said sixth combination of thermometer code signals and for developing a fifth one-of-n signal (258) the state of which indicates when said sixth combination of thermometer code signals has said second predetermined signal state pattern; and third blocking means (364 and 374) connected to said third one-of-n detecting means and to said signal combining means, said third blocking means for gating together said fifth one-of-n signal and a second blocking signal and for developing a sixth one-of-n signal (384) having a predetermined state when said fifth combination of thermometer code signals has said first predetermined signal state pattern and having a state which indicates when said sixth combination of thermometer code signals has said second predetermined signal state pattern otherwise; and wherein said signal combining means is further connected to said third error detecting means and wherein said signal combining means further gates together said first, said second, and said third error signals and develops said second blocking signal the state of which indicates when at least one of said first, said third, and said fifth combinations of thermometer code signals has said first predetermined signal state pattern.

3. A thermometer-code-to-one-of-n converter as recited in claim 2 further comprising, fourth error detecting means (214 and 234) connected to receive a seventh predetermined combination of at least two of said thermometer code signals, said fourth error detecting means for gating together said seventh combination of thermometer code signals and for developing a fourth error signal (272) the state of which indicates when said seventh combination of thermometer code signals has said first predetermined signal state pattern;

fourth one-of-n detecting means (212 and 232) connected to receive an eighth predetermined combination of at least two of said thermometer code signals, said fourth one-of-n detecting means for gating together said eighth combination of thermometer code signals and for developing a seventh one-of-n signal (266) the state of which indicates when said eighth combination of thermometer code signals has said second predetermined signal state pattern; and fourth blocking means (366 and 376) connected to said fourth one-of-n detecting means and to said signal combining means, said fourth blocking means for gating together said seventh one-of-n signal and a third blocking signal and for developing an eighth one-of-n signal (386) having a predetermined state when said seventh combination of thermometer code signals has said first predetermined signal state pattern and having a state which indicates when said eighth combination of thermometer code signals has said second predetermined signal state pattern otherwise; and wherein said signal combining means is further connected to said fourth error detecting means and wherein said signal combining means further gates together said first, said second, said third, and said fourth error signals and develops said second blocking signal the state of which indicates when at least one of said first, said third, said fifth, and said seventh combinations of thermometer code signals has said first predetermined signal state pattern.

4. A thermometer-code-to-one-of-n converter as recited in claim 1 wherein said first and said third predetermined combinations of said thermometer code signals each includes at least three of said thermometer code signals and wherein said first predetermined pattern of thermometer code signals is a one-zero-zero pattern.

5. A thermometer-code-to-one-of-n converter as recited in claim 1 wherein said second and said fourth predetermined combinations of said thermometer code signals each includes at least three of said thermometer code signals and wherein said second predetermined pattern of thermometer code signals is a zero-zero-one pattern.

6. A thermometer-code-to-one-of-n converter as recited in claim 5 wherein said first and said third predetermined combinations of said thermometer code signals each includes at least three of said thermometer code signals and wherein said first predetermined pattern of thermometer code signals is a one-zero-zero pattern.

7. An analog-to-digital converter for receiving an analog signal and for developing a plurality of digital signals representing the instantaneous potential level of the analog signal, the analog-to-digital converter comprising in combination:

an analog-to-thermometer-code converter (110) connected to receive the analog signal, said analog-to-thermometer-code converter for developing a plurality of signals representing in thermometer code said instantaneous potential level of said analog signal;

a thermometer-code-to-one-of-n converter (112) connected to said analog-to-thermometer-code converter, said thermometer-code-to-one-of-n converter including, first error detecting means (206 and 226) connected to said analog-to-thermometer-code converter to receive a first predetermined combination of at least two of said thermometer code signals, said first error detecting means for gating together said first combination of thermometer code signals and for developing a first error signal (256) the state of which indicates when said first combination of thermometer code signals has a first predetermined pattern of signal states, first one-of-n detecting means (204 and 224) connected to said analog-to-thermometer-code converter to receive a second predetermined combination of at least two of said thermometer code signals, said first one-of-n detecting means for gating together said second combination of thermometer code signals and for developing a first one-of-n signal (254) the state of which indicates when said second combination of thermometer code signals has a second predetermined pattern of signal states, second error detecting means (202 and 222) connected to said analog-to-thermometer-code converter to receive a third predetermined combination of at least two of said thermometer code signals, said second error detecting means for gating together said third combination of thermometer code signals and for developing a second error signal (252) the state of which indicates when said third combination of thermometer code signals has said first predetermined signal state pattern, second one-of-n detecting means (200 and 220) connected to said analog-to-thermometer-code converter to receive a fourth predetermined combination of at least two of said thermometer code signals, said second one-of-n detecting means for gating together said fourth combination of thermometer code signals and for developing a second one-of-n signal (250) the state of which indicates when said fourth combination of thermometer code signals has said second predetermined signal state pattern, signal combining means (302 and 304) connected to said first and said second error detecting means, said signal combining means for gating together said first and said second error signals and for developing a first blocking signal (342) the state of which indicates when at least one of said first and said third combinations of thermometer code signals has said first predetermined signal state pattern, first blocking means (362 and 372) connected to said first one-of-n detecting means and to said signal combining means, said first blocking means for gating together said first one-of-n signal and a signal derived from said first error signal and for developing a third one-of-n signal (382) having a predetermined state when said first combination of thermometer code signals has said first predetermined signal state pattern and having a state which indicates when said second combination of thermometer code signals has said second predetermined signal state pattern otherwise, and second blocking means (360 and 370) connected to said second one-of-n detecting means and to said signal combining means, said second blocking means for gating together said second one-of-n signal and said first blocking signal and for developing a fourth one-of-n signal (380) having a predetermined state when at least one of said first and said third combinations of thermometer code signals has said first predetermined signal state pattern and having a state which indicates when said fourth combination of thermometer code signals has said second predetermined signal state pattern otherwise; and a one-of-n-to-binary-code converter (114) connected to said first blocking means to receive said third one-of-n signal and connected to said second blocking means to receive said fourth one-of-n signal, said a one-of-n-to-binary-code converter for developing the digital signals.

8. A thermometer-code-to-one-of-n converter for receiving a plurality of signals representing a number in thermometer code and for developing a plurality of signals representing the number in one-of-n code, the thermometer code signals including, at least one first signal (196),
at least one second signal (194),
at least one third signal (192 and 182),
at least one fourth signal (180),
at least one fifth signal (242), and
at least one sixth signal (240), the thermometer-code-to-one-of-n converter comprising in combination:

first error detecting means (206 and 226) connected to receive a first predetermined combination of the thermometer code signals including said first, said second, and said third (182) signals, said first error detecting means for gating together said first combination of thermometer code signals and for developing a first error signal (256) the state of which indicates when said first combination of thermometer code signals has a first predetermined pattern of signal states;

first one-of-n detecting means (204 and 224) connected to receive a second predetermined combination of said thermometer code signals including said third (182), said fourth, and said fifth signals, said first one-of-n detecting means for gating together said second combination of thermometer code signals and for developing a first one-of-n signal (254) the state of which indicates when said second combination of thermometer code signals has a second predetermined pattern of signal states;

second error detecting means (202 and 222) connected to receive a third predetermined combination of said thermometer code signals including said second, said third (192), and said fourth signals, said second error detecting means for gating together said third combination of thermometer code signals and for developing a second error signal (252) the state of which indicates when said third combination of thermometer code signals has said first predetermined signal state pattern;

second one-of-n detecting means (200 and 220) connected to receive a fourth predetermined combination of said thermometer code signals including said fourth, said fifth, and said sixth signals, said second one-of-n detecting means for gating together said fourth combination of thermometer code signals and for developing a second one-of-n signal (250) the state of which indicates when said fourth combination of thermometer code signals has said second predetermined signal state pattern;

signal combining means (302 and 304) connected to said first and said second error detecting means, said signal combining means for gating together said first and said second error signals and for developing a first blocking signal (342) the state of which indicates when at least one of said first and said third combinations of thermometer code signals has said first predetermined signal state pattern;

first blocking means (362 and 372) connected to said first one-of-n detecting means and to said signal combining means, said first blocking means for gating together said first one-of-n signal and a signal derived from said first error signal and for developing a third one-of-n signal (382) having a predetermined state when said first combination of thermometer code signals has said first predetermined signal state pattern and having a state which indicates when said second combination of thermometer code signals has said second predetermined signal state pattern otherwise; and second blocking means (360 and 370) connected to said second one-of-n detecting means and to said signal combining means, said second blocking means for gating together said second one-of-n signal and said first blocking signal and for developing a fourth one-of-n signal (380) having a predetermined state when at least one of said first and said third combinations of thermometer code signals has said first predetermined signal state pattern and having a state which indicates when said fourth combination of thermometer code signals has said second predetermined signal state pattern otherwise.

9. A thermometer-code-to-one-of-n converter as recited in claim 8 wherein said first predetermined pattern of thermometer code signals is a one-zero-zero pattern.

10. A thermometer-code-to-one-of-n converter as recited in claim 8 wherein said second predetermined pattern of thermometer code signals is a zero-zero-one pattern.

11. A thermometer-code-to-one-of-n converter as recited in claim 10 wherein said first predetermined pattern of thermometer code signals is a one-zero-zero pattern.

* * * * *